United States Patent [19]
Anthony et al.

[11] 4,063,966
[45] * Dec. 20, 1977

[54] METHOD FOR FORMING SPACED ELECTRICALLY ISOLATED REGIONS IN A BODY OF SEMICONDUCTOR MATERIAL

[75] Inventors: Thomas R. Anthony; Harvey E. Cline, both of Schenectady, N.Y.

[73] Assignee: General Electric Company, Schenectady, N.Y.

[*] Notice: The portion of the term of this patent subsequent to Sept. 7, 1993, has been disclaimed.

[21] Appl. No.: 676,994

[22] Filed: Apr. 14, 1976

Related U.S. Application Data

[63] Continuation-in-part of Ser. No. 519,913, Nov. 1, 1974, Pat. No. 3,979,230, which is a continuation-in-part of Ser. No. 411,022, Oct. 30, 1973, Pat. No. 3,904,442.

[51] Int. Cl.$^2$ .......................................... H01L 21/208
[52] U.S. Cl. .......................................... 148/1.5; 148/171; 148/177; 148/187; 252/62.3 GA; 357/48
[58] Field of Search ................ 148/1.5, 171, 172, 186, 148/187, 188, 177, 179; 252/62.3 GA, 62.3 E; 357/48

[56] References Cited
U.S. PATENT DOCUMENTS

| | | | |
|---|---|---|---|
| 2,813,048 | 11/1957 | Pfann | 148/1 |
| 3,897,277 | 7/1975 | Blumenfeld | 148/1.5 |
| 3,899,362 | 8/1975 | Cline et al. | 148/1.5 |
| 3,904,442 | 9/1975 | Anthony et al. | 148/1.5 |
| 3,956,023 | 5/1976 | Cline et al. | 148/1.5 |
| 3,956,024 | 5/1976 | Cline et al. | 148/172 X |
| 3,956,026 | 5/1976 | Cline et al. | 148/171 X |
| 3,979,230 | 9/1976 | Anthony et al. | 148/1.5 |
| 3,979,820 | 9/1976 | Anthony et al. | 29/577 |

*Primary Examiner*—G. Ozaki
*Attorney, Agent, or Firm*—Donald M. Winegar; Joseph T. Cohen; Jerome C. Squillaro

[57] ABSTRACT

An array of vapor deposited metal wires is migrated by TGZM through a body of semiconductor material to divide the body into a plurality of individual regions electrically isolated from each other. The preferred crystal orientations of the surface on which migration is initiated, directions of wire alignment on that surface, wire sizes and preferred axes of migration are disclosed herein.

37 Claims, 10 Drawing Figures

METHOD FOR FORMING SPACED ELECTRICALLY ISOLATED REGIONS IN A BODY OF SEMICONDUCTOR MATERIAL

CROSS-REFERENCE TO RELATED PATENT APPLICATION

This invention is a Continuation-In-Part of our copending patent application, Ser. No. 519,913, filed Nov. 1, 1974, now U.S. Pat. No. 3,979,230, which was a Continuation-In-Part of our patent application, Ser. No. 411,022, filed Oct. 30, 1973, now U.S. Pat. No. 3,904,442, and all being assigned to the same assignee as the present invention.

BACKGROUND OF THE INVENTION

1. Field of the Invention

This invention relates to P-N junction isolation grids for semiconductor devices and method of making the same.

2. Description of the Prior Art

W. G. Pfann describes in "Zone Melting", John Wiley and Sons, Inc., New York (1966), a thermal gradient zone melting process to produce P-N junctions within the bulk of a semiconductor. In this method, either sheets or wires of suitable metallic liquid are moved through a semiconductor material in a thermal gradient. Doped liquid-epitaxial material is left behind as the liquid wire migration progresses. However, several investigators found the planar liquid zone was unstable and droplets of liquid broke away from the zone and were trapped in the recrystallized material. Thus, material produced by TGZM was not suitable for the manufacture of semiconductor devices. No real success was ever achieved in any of these efforts to the best of our knowledge and no commercially feasible adaptation of TGZM exists elsewhere today. Earlier efforts used relatively thick liquid zones because of the ease in placing a metal foil in between two semiconductor crystals. Problems of wetting and instability of the zone were recognized but no solution was found. In addition, observation of the crystal produced showed trapped liquid and unstable migration.

In our copending applications:

High Velocity Thermomigration Method of Making Deep Diodes, Ser. No. 411,015, now U.S. Pat. No. 3,898,106; Deep Diode Device and Method, Ser. No. 411,009, now U.S. Pat. No. 3,902,925; Deep Diode Devices and Method and Apparatus, Ser. No. 411,001, and now abandoned in favor of Ser. No. 552,154; Method of Making Deep Diode Devices, Ser. No. 411,150, now U.S. Pat. No. 3,901,736; High Velocity Thermal Migration Process of Making Deep Diodes, Ser. No. 411,021, now U.S. Pat. No. 3,910,801; and Stabilized Droplet Migration Method of Making Deep Diodes Having Uniform Electrical Properties, Ser. No. 411,008, now U.S. Pat. No. 3,899,361; assigned to the same assignee of this application, we teach the stability of droplets, planar zones and line migrations and critical dimensions affecting the thermal migration thereof. However, we have found that even with this available knowledge the formation of a P-N junction isolation grid is not a simple adaptation of the available knowledge we had developed.

Therefore, it is an object of this invention to provide a new and improved method of manufacturing a P-N junction isolation grid for semiconductor devices.

Another object of this invention is to provide a new and improved method for manufacturing a P-N isolation grid for semiconductor devices which correlates planar orientation of the surface of the semiconductor materials, directions of wires as disposed on the surface and the direction of the migration of the wires relative to the crystallography of the semiconductor material.

Other objects of this invention will, in part, be obvious and will, in part, appear hereinafter.

BRIEF DESCRIPTION OF THE INVENTION

In accordance with the teachings of this invention, there is provided a method a P-N junction isolation grid in a body of semiconductor material. The grid is comprised of a first group of planar regions, each of which are substantially parallel to each other and disposed a predetermined distance apart from each other and a second group of planar regions which are substantially parallel to each other, disposed a predetermined distance apart from each other and disposed at a preselected angle to at least one of the planar regions of the first group. The method comprises the process steps of disposing a first array of metal wires on a selected surface of a body of semiconductor material having a selected resistivity, a selected conductivity and a preferred planar crystal orientation. The vertical axis of the body is substantially aligned with a first axis of the crystal structure. The direction of the metal wires is oriented to substantially coincide with at lest one of the other axes of the crystal structure. The body is heated to a temperature sufficient to form an array of liquid wires of metal-rich material on the surface of the body. A temperature gradient is established along substantially the vertical axis of the body and the first axis of the crystal structure. The array of metal-enriched semiconductor material is migrated through the body along the first axis of the crystal structure to form a plurality of planar regions of recrystallized material of the body. The planar regions so formed may be of the same, or different type conductivity than that of the body. In a similar manner, a second array of liquid metal-rich material is migrated through the body at a selected angle to the first array to produce a grid like structure in the body. Depending upon the planar orientation of the surface of the body, the orientation of the direction of the metal wires on the surface and the direction of the migration, the grid is produced by simultaneous migration of the intersecting lines or by a plurality of migrations of individual groups of metal wires.

A third array of liquid metal-rich material is migrated through the body in a similar manner to form a grid structure wherein triangular regions of the body are electrically isolated from each other.

Additionally, a planar region of like conductivity is formed in, or on, the bottom surface portion of the body to provide individual electrically isolated cells. These are particularly suitable for planar and mesa devices which are contacted from one surface only.

DESCRIPTION OF THE INVENTION

Figure 1:
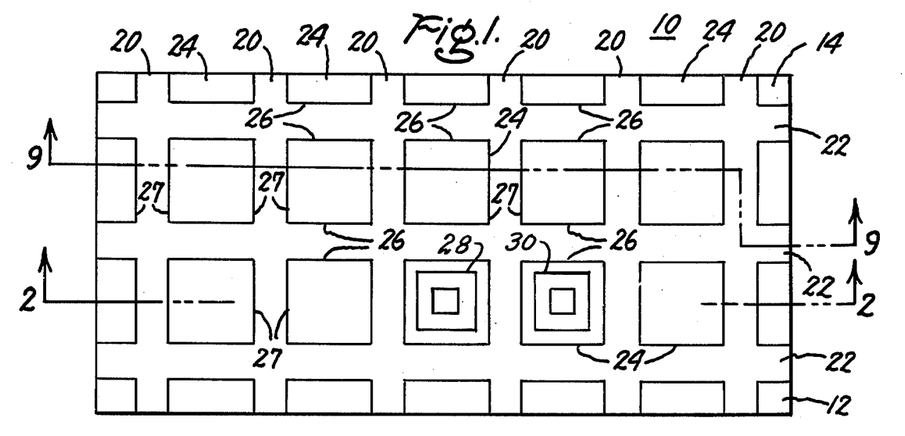
FIG. 1 is a top planar view of a P-N junction isolation grid made in accordance with the teachings of the invention.
Figure 2:
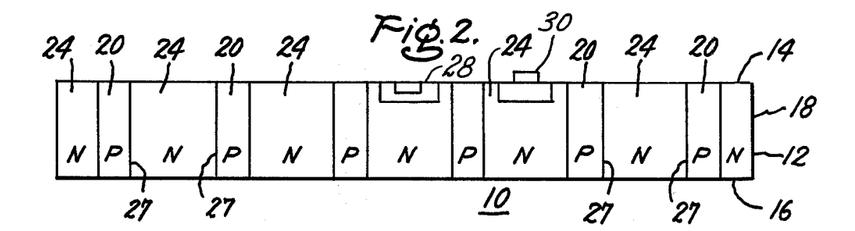
FIG. 2 is an elevation view, in cross-section of the grid of FIG. 1 taken along the cutting plane II—II.

Referring to FIGS. 1 and 2, there is shown a semiconductor device 10 comprising a body 12 of single crystal semiconductor material having a selected resistivity and a first type conductivity. The semiconductor material comprising the body 12 may be silicon, germanium, silicon carbide, gallium arsenide or any other semiconductor material preferably having a diamond cubic crystal structure. The body 12 has two major surfaces 14 and 16, which define the top and bottom surfaces thereof respectively, and a peripheral side surface 18.

A plurality of first spaced planar regions 20 are disposed in the body substantially parallel to each other. Preferably, for semiconductor device fabrication, each of the regions 20 is oriented substantially perpendicular to the top and bottom surfaces, 14 and 16, respectively, and the peripheral side surface 18. Each of the regions 20 has a peripheral side surface which is coextensive with the respective surface 14, 16 and 18 of the body 12. A P-N junction 27 is formed by the contiguous surfaces of each region 20 and the immediately adjacent material of the body 12.

A plurality of second spaced planar regions 22 are disposed in the body 12 substantially parallel to each other. Preferably, for semiconductor device fabrication, each of the regions 22 is oriented substantially perpendicular to the respective top and bottom surfaces, 14 and 16 and the side surface 18. In addition, each of the regions 22 is preferably perpendicular to, and intersects one or more of the plurality of first spaced planar regions 20. However, the regions 20 and 22 may be at a preselected angle to each other. Each of the second planar regions 22 has a peripheral side surface which is coextensive with the surfaces 14, 16 and 18 of the body 12. A P-N junction 26 is formed by the contiguous surfaces of each region 22 and the immediately adjacent material of the body 12. The intersecting planar regions 20 and 22 define an egg-crate configuration which divides the body 12 into a plurality of third regions 24 of first type conductivity electrically isolated from each other.

Preferably, each of the regions 20 and 22 are of the same type conductivity, the conductivity being of a second, and opposite type, than that conductivity of the body 12 and the regions 24. Temperature gradient zone melting is the preferred process means for forming the regions 20 and 22 in the body 12. A temperature gradient of from 50° C per centimeter to 200° C per centimeter for a migration temperature range of from 700° C to 1350° C has been found to be suitable for the TGZM processing technique of this invention. The material of the planar regions 20 and 22 comprises recrystallized material of the body 12 having a concentration of an impurity constituent which imparts the second, and opposite type, conductivity thereto. It is recrystallized material with solid solubility of the impurity therein. It is not a recrystallized material with liquid solubility of the impurity. Neither is it recrystallized material of eutectic. Each of the planar regions 20 and 22 has a substantially uniform resistivity throughout its entire region. The width of each of the regions 20 and 22 is substantially constant over the entire region and is determined by whatever photomasking geometry is used to define the regions 20 and 22. In particular, the body 12 may be of silicon semiconductor material of N-type conductivity and the regions 22 and 24 are aluminum doped recrystallized silicon to form the required P-type conductivity regions. Similarly, the body 12 may be of P-type conductivity and the regions 22 and 24 have material which may be of antimony doped recrystallized material of the body 12.

The P-N junctions 27 and 26 are well defined and shown an abrupt transition from one region of conductivity to the next adjacent region of opposite type conductivity. The abrupt transition produces a step P-N junction. Linearly graded P-N junctions 27 and 26 are obtained by a post diffusion heat treatment of the grid structure at a selected elevated temperature.

The plurality of planar regions 20 and 22 electrically isolate each region 24 from all of the remaining regions 24 by the back-to-back relationship of the respective segments of the P-N junctions 27 and 26. The electrical isolation achieved by this novel egg crate design enables one to associate one or more semiconductor devices with one or more of the plurality of regions 24 of first type conductivity. The devices may be planar semiconductor devices 28 formed in mutually adjacent regions 24 and/or mesa semiconductor devices 30 formed on mutually adjacent regions 24 and still protect the electrical integrity of each device 28 or 30 without disturbing the mutually adjacent devices. Devices 28 and 30 may, however, be electrically to produce integrated circuits and the like.

The spaced planar regions 20 and 22 besides offering excellent electrical isolation between mutually adjacent regions 24 have several other distinct advantages over prior art electrical isolation regions. Each of the regions 20 and 22 have a substantially constant uniform width and a substantially constant uniform impurity concentration for its entire length and depth. In addition, the planar regions 20 and 22 may be fabricated before or after the fabrication of the basic devices 28 and 30. Preferably, the regions 20 and 22 are fabricated after the highest temperature process step necessary for the fabrication of the devices 28 and 30 has been practiced first. This preferred practice limits, or substantially eliminates, any sideways diffusion of the impurity of the regions 20 and 22 which tends to increase the width of the regions 20 and 22 and thereby decrease the abruptness of the P-N junction and the transition between the opposite type conductivity regions. However, should a graded P-N junction be desired, a post-migration heat treatment may be practiced for a time sufficient to obtain the desired width of a graded P-N junction. Further, the planar regions 20 and 22 maximize the volume of the body 12 which can be utilized for functional electrical devices to a greater extent than can be achieved by prior art devices.

It has been discovered that one has to have a particular planar orientation of the surface of the body, a selected orientation of the direction of metal "wires" with respect to the planar orientation and to the axis of the crystal structure of the material of the body along which thermal migration of the "wires" is practiced. The term "wires" refers to wires formed by vapor deposition preferably, although other suitable means including solid wire, may be employed provided good wetting of the semiconductor material is achieved by the metal to be migrated.

Figure 3:
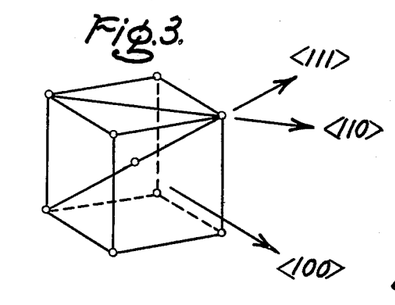
FIG. 3 is a diamond cubic crystal structure.

With reference to FIG. 3, for the diamond cubic crystal structure of silicon, silicon carbide, germanium, and the like, P-N junction grids are only produced in bodies of semiconductor material having two particular orientations of the planr region of the surface. These selected planar regions are the (100) plane and the (111) plane. The (100) plane is that plane which passes through a pair of diagonally opposite edges of the unit cubic. Those planes which pass through a corner atom and through a pair of diagonally opposite atoms located in a face not containing the first mentioned atoms are generally identified as (111) planes. As a matter of convenience, directions in the unit cube which are perpendicular to each of these general planes (X Y Z) are customarily referred to as the "crystal zone axis" of the particular planes involves, or more usually as the "$<$ X Y Z$>$ direction".

Figure 4:
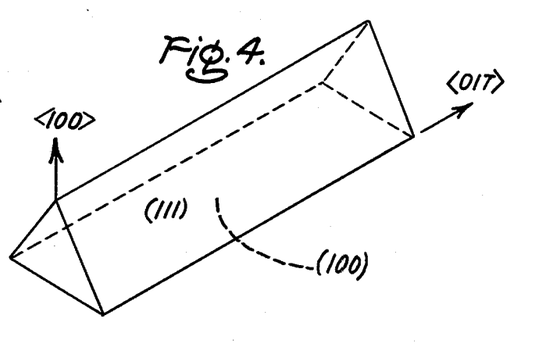
FIG. 4 is the morphological shape of wires which migrated stably in the $<100>$ direction.

The crystal zone axis of the (100) generic plane will be referred to as the $<100>$ direction and the crystal zone axis of the (111) plane as the $<111>$ direction, and to the crystal zone axis of the (110) plane as the $<110>$ direction. Examples of these directions with respect to the unit cube are shown by the appropriately identified arrows in FIG. 3. In particular, for the (100) planar orientation, metal-rich "wires" of material can only be migrated stably in a crystal lattice direction which is the $<100>$ direction. In addition, only "wires" lying in the $<011>$ and the $<0\bar{1}1>$ directions are stable in migration in the $<100>$ axis direction. The morphological shape of these stable metal-rich "wires" of material is shown in FIG. 4. Solid-liquid surface tension causes coarsening of the ends of the stable metal-rich liquid "wires".

Although lying in the same (100) planar region, "wires" of metal-rich liquid, which lay in directions other than the $<011>$ and $<0\bar{1}1>$ directions, are unstable and break up into a row of pyramidal square-base droplets of metal-rich liquid material because of severe faceting of the solid-liquid interface of wires lying in these directions. Thus, for example, "wires" lying in the $<012>$ and $<02\bar{1}>$ directions are unstable.

The dimensions of the metal "wires" also influence the stability of the metal "wires". Only metal "wires" which are no greater than 100 microns in width are stable during the migration of the "wires" in the $<100>$ direction for a distance of at least one centimeter into the body of semiconductor material. Wire stability increases with decreasing "wire" size. The more the size of the liquid metal "wire" exceeds 100 microns, the less the distance that the liquid "wire" is able to penetrate the body during migration before the "wire" becomes unstable and breaks up.

A critical factor influencing the liquid metal "wire" stability during migration is the parallelism of the applied thermal gradient to either the $<100>$, $<110>$ or $<111>$ crystallographic directions. An offaxis component of the thermal gradient in general decreases the stability of the migrating liquid by causing tooth-like, or serrated faces to develop in the side faces of the "wire". When the tooth-like facets become too large, the "wire" breaks up and loses its continuity.

To fabricate the grid structure 10 of FIGS. 1 and 2 wherein the planar region is (100) and the migration direction is $<100>$, it is necessary to migrate a first array of liquid "wires" through the body 12 to form the regions 20 and then perform a second migration for a second array of liquid "wires" through the body 12 to form the second regions 22. Simultaneous migration of the liquid "wires" to form the regions 20 and 22 most often results in discontinuities in the grid structure. Investigation of the reasons for the discontinuities indicates that surface tension of the molten metal-rich material at the intersections of two migrating liquid "wires" is sufficiently great to cause discontinuities in the intersecting liquid "wires". Apparently, the solid-liquid surface tension is sufficient for each portion of the intersecting migrating "wires" to cause the metal-rich liquid to remain with its own "wire" portion instead of being distributed uniformly throughout the intersection of the "wires" in the body 12. As a result, material of the body 12 at the advancing interface of the supposedly intersecting liquid wires does not become wetted by the liquid "wires" or even contacted by the liquid and therefore is not dissolved into the advancing metal-rich liquid. Therefore, discontinuity occurs at the intersection and further advancement of the liquid "wires" produces an imperfect grid. In instances where the discontinuity of the grid is present, mutually adjacent regions 24 are not electrically isolated from each other and may deleteriously by effect the reliability of electrical circuitry associated therewith.

Figure 5:
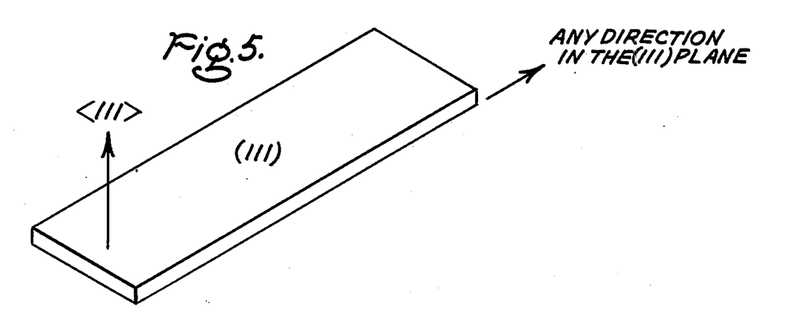
FIG. 5 is the morphological shape of wires which migrate stably in the < 111 > direction.
Figure 6:
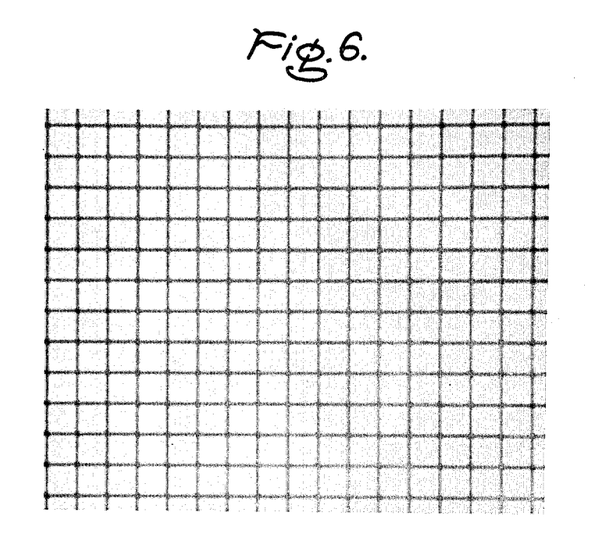
FIG. 6 is a top planar view of a grid on the entrance surface of a body of silicon processed in accordance with the teachings of this invention.
Figure 7:
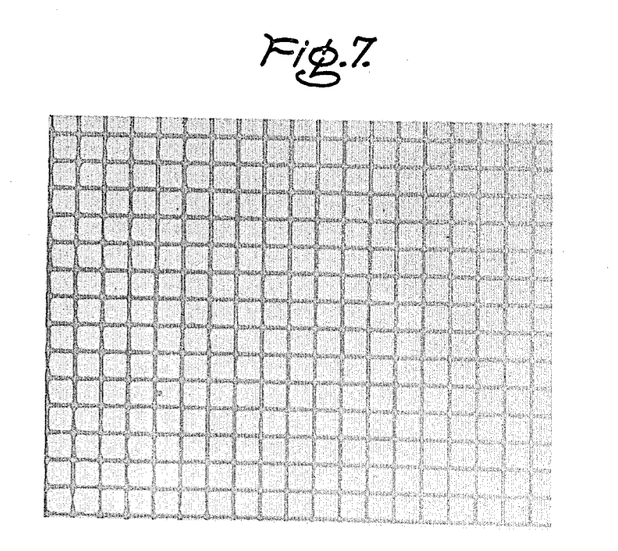
FIG. 7 is a bottom planar view of a grid on the exit surface of a body of silicon processed in accordance with the teachings of this invention.

The stability of "wires" lying in a (111) plane for the surface 14 and migrating in a $<111>$ direction through the body 12 to the surface 16 is not generally sensitive to the crystallographic direction of the "wire". This generally stability of wires lying in the (111) plane results from the fact that the (111) plane is the facet plane for the metal-rich liquid-semiconductor system. The morphological shape of a "wire" in the (111) plane is shown in FIG. 5 and the top and bottom surfaces are in the (111) plane. Therefore, both the forward and the rear faces of these "wires" are stable provided the wire does not exceed a preferred width.

The side faces of a "wire" lying in the (111) plane are not as equally as stable as the top and bottom surfaces. Edges of the side faces lying the $<1\bar{1}0>$, $<10\bar{1}>$ and the $<01\bar{1}>$ directions have (111) type planes as side faces. Consequently, these "wires" are stable to any sidways drift that may be generated should the thermal gradient be not substantially aligned along the $<111>$ axis. Other "wire" directions in the (111) plane such, for example, as the $<11\bar{2}>$ type "wire" directions develop serrations on their side faces if they drift sideways as a result of a slightly off axis thermal gradient. Eventually, the continuing migrating "wire" breaks up completely or bends into a $<1\bar{1}0>$ type line direction. Therefore, a resonably well aligned thermal gradient permits thermal migration of $<11\bar{2}>$ type direction "wires" through at least bodies of semiconductor material one centimeter in thickness by the temperature gradient zone melting process without either breaking up of the "wire" or serrations of the edges of the migrating wire occurring.

Figure 8:
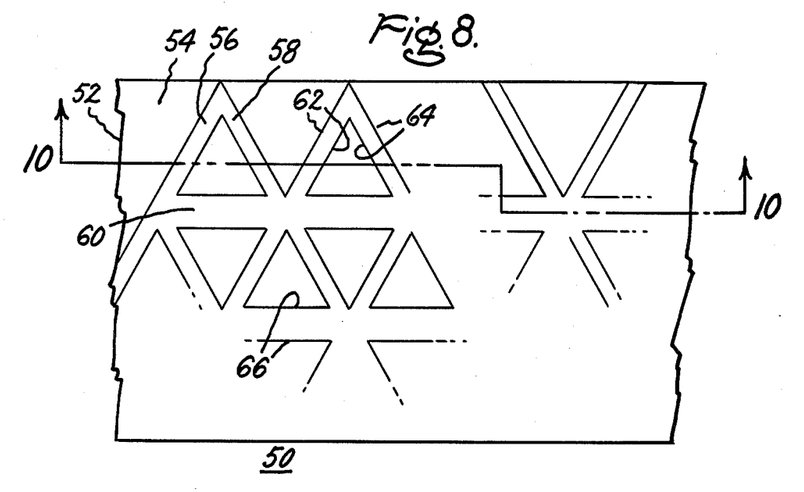
FIG. 8 is a elevation view, in cross-section, of an alternate embodiment of a P-N junction isolation grid made in accordance with the teachings of this invention.

In the thermal migrating of liquid "wires" through bodies of semiconductor material having an initial (111) wafer plane, the most stable "wire" directions are $<$ $01\bar{1}>$, $<10\bar{1}>$ and $<1\bar{1}0>$. The width of each of these "wires" may be up to approximately 500 microns and still maintain stability during thermal migration. A triangular grid 50, as shown in FIG. 8, comprising a plurality of "wires" lying in the three "wire" directions $<01\bar{1}<$, $<10\bar{1}>$ and $<1\bar{1}0>$ is not readily obtainable by thermal migration embodying the temperature gradient zone melting (TGZM) process of all three "wires" simultaneously. The surface tension of the melt of metal-rich semiconductor material at the intersection of the three "wire" directions is sufficient to disrupt the line directions and result in an interruption of the grid structure. The grid, therefore, is preferably achieved by three separate TGZM processes embodying liquid "wire" migration of one "wire" direction at a time. The resulting structure as shown comprises the body 52 of semiconductor material having a first type conductivity and a selective level of resistivity having a top surface 54 and planar isolation regions 56, 58 and 60 wherein the material of each is recrystallized semiconductor material having a solid solubility of a dopant metal therein to impart a second and opposite type conductivity and a selective level of resistivity thereto. P-N junctions 62, 64 and 66 are formed by the contiguous surface of the material of the body 52 and the respective regions 56, 58 and 60.

"Wires" of a $<11\bar{2}>$, $<\bar{2}11>$ and $<1\bar{2}1>$ direction are less stable than the $<01\bar{1}>$, $<0\,10\bar{1}>$ and $<1\bar{1}0>$ "wire" directions during thermal migration but more stable than any other "wire" directions in the (111) plane. The "wires" may have a width of up to 500 microns and still maintain their stability during thermal migration.

Any other "wire" direction in the (111) plane not disclosed heretofore may be migrated through the body of semiconductor material. However, the "wires" of these "wire" directions have the least stability of all the "wire" directions of the (111) plane in the presence of an off axis thermal gradient. "Wires" of a width up to 500 microns are stable during migration for all "wires" lying in the (111) plane regardless of "wires" direction.

The perpendicular P-N junction isolation grid of FIGS. 1 and 2, or of any other configuration of intersecting planar regions, may be fabricated by the simultaneous migration of one of the wire directions $<01\bar{1}>$, $<10\bar{1}>$ and $<1\bar{1}0>$ and one of any of the remaining wire directions. Alternatively, the grid may be produced by migrating each "wire" direction separately.

A summation of the stable "wire" directions for a particular planar direction and the stable "wire" sizes are tabulated in the following table:

TABLE

| Wafer Plane | Migration Direction | Stable Wire Directions | | Stable Wire Sizes |
|---|---|---|---|---|
| (100) | $<100>$ | $<011>$ * | | $<100$ microns |
|  |  | $<011>$ * | | $<100$ microns |
| (110) | $<110>$ | $<110>$ * | | $<150$ microns |
| (111) | $<111>$ | $<011>$ $<101>$ $<110>$ | a | $<500$ microns |
|  |  | $<11\bar{2}>$ * $<\bar{2}11>$ * $<1\bar{2}1>$ * | b | $<500$ microns |
|  |  | Any Other Direction in (111) plane | c | $<500$ microns |

TABLE-continued

| Wafer Plane | Migration Direction | Stable Wire Directions | Stable Wire Sizes |
|---|---|---|---|

* The stability of the migrating wire is sensitive to the alignment of the thermal gradient with the $<100>$, $<110>$ and $<111>$ axis, respectively.
Group a is more stable than group b which is more stable than group c.

The following example illustrates the teachings of this invention:

A body of a single crystal of silicon semiconductor material one inch in diameter, N-type, 10 ohm-centimeter resistivity, one centimeter in thickness of $<100>$ axial orientation was lapped and polished. A layer of silicon oxide was grown on the (100) planar surface. A square grid of line-array windows, 500 microns apart, and 50 microns each in width, were selectively etched in the silicon oxide employing photolithographic techniques well known to those skilled in the art and aligned with the $<0\bar{1}1>$ and $<011>$ "wire" directions. The line array was then etched through the silicon surface to a depth of 20 microns. A 20 micron-thick aluminu, film was deposited from an electron beam source into the line array etched in the silicon. The excess aluminum overlying the oxide mask was ground off leaving etched line array grooves filled with aluminum to form the "wires" for migration. The processed body of silicon was placed in an electron beam thermal migration apparatus designed to produce a very uniform vertical temperature gradient. A thermal gradient of 50° C per centimeter at 1200° C at a pressure of $1 \times 10^{-5}$ torr was employed to migrate the aluminum "wires" through the body. The excess aluminum was removed from the exit side of the body.

The entrance and exit surface of the body of silicon were polished and chemically stained by a solution of 33 parts HF, 66 parts HNO$_3$, 400 parts acetic acid and 1 part saturated CuNO$_3$ water solution by volume to reveal the P-type grid structure on both surfaces. The grid was well defined on both surfaces. There were no discontinuities in the grid. Electrical tests revealed the regions 24 were electrically isolated from each other. The regions 20 and 24 had a uniform resistivity of $8 \times 10^{-3}$ ohm-centimeter. The P-N junctions 27 and 26 has a breakdown voltage of 600 volts.

The processed body was sectioned to study the migration of the wires through the body at various depths. After polishing and chemical staining of the surfaces of the sections of the body, the grid structure was clearly defined on the entrance and exit surfaces of each section of the body. The grid was continuous throughout. The regions 24 were electrically isolated from each other. In addition, no appreciable changes were detected in the electrical characteristics of the regions 20 and 22 and the P-N junctions 27 and 26.

In addition to the preferred "wire" directions for the different planar orientations, we have discovered that any "wire" direction for the three planar orientations will migrate satisfactorily through a thin body of semiconductor material. The thin body preferably should not be greater than three or four times the preferred thickness of the layer of metal deposited on the surface of the body for the thermal migration therethrough. Therefore, for the migration of aluminum through a thin body of silicon, the body should not be greater than approximately 100 microns in thickness for a wire thickness not exceeding the order of 25 to 30 microns.

In addition, wider "wires" than the ones disclosed in the table as being preferred, may be migrated through a thin body of semiconductor material. It has been found these metal "wires" of greater widths as stated in the table may be migrated through a body of semiconductor material provided the thickness of the body is less than about 3 to 4 times the thickness of the vapor deposited metal "wire" migrated therethrough. It has also been discovered that the migration of these metal "wires" may be practiced successfully because the "wires" do not have the sufficient distance of travel necessary before break up of the liquid "wire" can occur.

The electrical isolation cells shown and described so far as illustrative of cells where ohmic electrical contacts can be affixed to both major surfaces of the initial body of semiconductor material as may be required. Therefore, semiconductor devices incorporated in each cell mnay be contacted from both surfaces. Alternately, if complete electrical isolation is required for each cell some means must be provided to accomplish the same.

Figure 9:
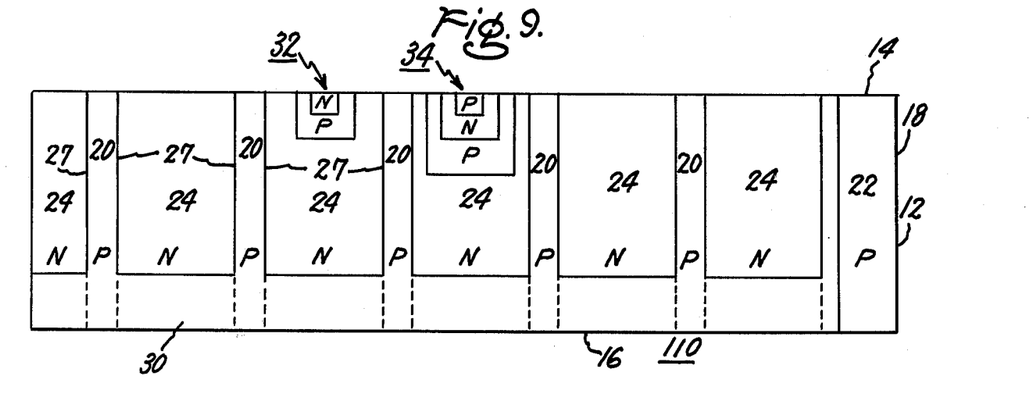
FIGS. 9 and 10 are each an elevation view, in cross-section, of an alternate embodiment of the device of FIGS. 1 and 2.

Referring now to FIG. 9, there is shown a device 110 which is an alternate embodiment of the device 10 of FIGS. 1 and 2. Each cell is electrically isolated from each other and from any mount affixed to the bottom surface 16 of the device 110. All items denoted by the same reference numeral as used in describing the device 10 are the same as, and function in the same manner, as the same items of FIGS. 1 and 2.

A region 30 of the same type conductivity as the regions 20 and 22 of the device is formed in the device 110 and is substantially parallel to the opposed surfaces 14 and 16. The surface 16 of the device 110 is also the surface of the region 30. The region 30 may be formed by any suitable means known to those skilled in the semiconductor processing art such, for example, as by diffusion, epitaxial growth, and the like. Preferably, the region 30 is formed prior to the formation of the regions 20 and 22. The thermal gradient zone melting process is a very short timewise process to practice when compared to time required for diffusion and epitaxial growth processes. Therefore, the regions 20 and 24 may also be formed after the formation of semiconductor devices in the individual cells such, for example, as after the formation of diode 32 or transistor 34. Although practiced at elevated temperatures of from 400° C to 1400° C, the TGZM process has little effect on the previously formed P-N junctions.

Figure 10:
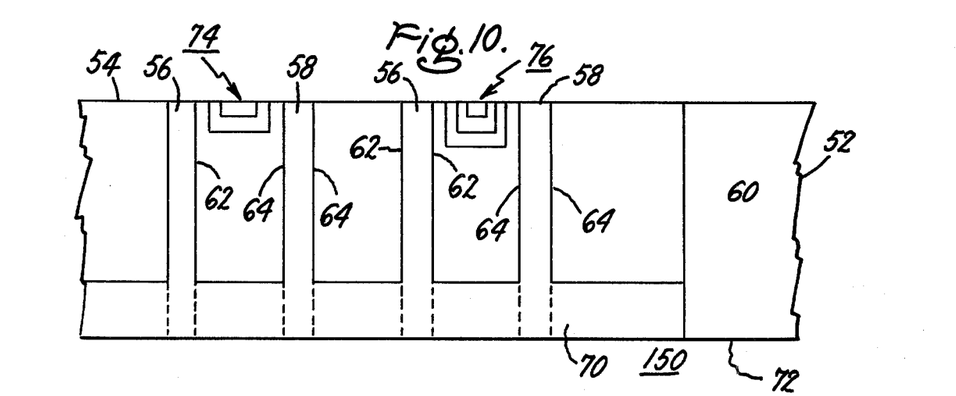

With reference to FIG. 10, there is shown a device 150 which is an alternate embodiment of the triangular grid 50 of FIG. 8. All items denoted by the same reference numerals in FIG. 10 which are the same as those of FIG. 8 are the same, and function in the same manner, as previously described. A region 70 of the same type conductivity as that of the regions 56, 58, and 60 is formed in the bottom portion of the body 52 by diffusion through the bottom surface 72, or grown on the surface 72 by an epitaxial growth technique and the like. Preferably, the region 70 is formed prior to the regions 56, 58 and 60, the reasons being the same as described heretofore relative to the formation of the region 30 in the device 110 of FIG. 9. A planar didode 74, a planar transistor 76, and the like, may be formed in the individual completely electrically isolated cells. All electrical contacts to the devices may then be made from the top surface of the device 150.

The metal wires are preferably formed by the vapor deposition of the one or more suitable metals in the etched grooves of the surface. It has been discovered that the vapor deposition of the metal layer forming the wire should be performed at a pressure of less than $5 \times 10^{-5}$ torr. When the pressure is greater than $3 \times 10^{-5}$ torr, we have found that in the case of aluminum metal deposited in the etched grooves that the metal does not reproducibly penetrate into the silicon or other semiconductor material and migrate through the body 12. It is believed that the metal layer is saturated with oxygen which prevents reduction of the very thin silicon oxide layer between the deposited metal and the silicon that was formed in the air shortly after etching the grooves or depressions. Thus the initial melt of the metal and the silicon required for migration is not obtained because of the inability of the metal to wet the silicon interface. In a similar manner, metal deposited by sputtering is not as desirable as the metal appears to be saturated with oxygen in the process thereby preventing the reduction of any intervening silicon oxide. The preferred methods od depositing the metal onto the silicon body 12 are by the electron beam method and the like wherein little, if any, oxygen is entrapped in the metal.

The processed body 12 is placed in thermal migration apparatus, not shown, and the metal wires in the depressions are migrated through the body by the previously described thermal gradient zone melting process. A thermal gradient of approximately 50° C/cm between the bottom face 16, which is the hot face, and the surface 14, which is the cold face, has been discovered to be appropriate. For aluminum migration, the average body temperature is from about 800° C to approximately 1400° C. For other materials, both for the wires and the body 12, the average temperature of the body during migration is from about 400° C to about 1400° C. The process is practiced for a sufficient length of time to migrate all the metal droplets and/or wires through the body 12. For example, for aluminum droplets and wires of 20 micron thickness, a thermal gradient of 50° C/cm., a 1200° C mean temperature of body 12, a pressure of $1 \times 10^{-5}$ torr, and a furnace time of less than 12 hours is required to migrate the wires and droplets through the silicon body 12 of one centimeter in thickness.

The thermal migration of wires and droplets may also be accomplished in apparatus utilizing inert atmospheres or ambient atmospheres at ambient or atmospheric pressure.

We claim as our invention:

1. A method for making a grid arrangement in a body of semiconductor material of a semiconductor device to produce a plurality of regions of semiconductor material of the body electrically isolated from one another, the method comprising
   a. selecting a body of single crystal semiconductor material having a preferred crystallographic structure, two major opposed surfaces being respectively the top and bottom surfaces thereof, a preferred planar orientation of at least the top surface, the planar orientation being one selected from the group consisting of (100) and (111), a first selected type conductivity, a selected level of resistivity and having a vertical axis substantially aligned with a first axis of the crystal structure;
   b. forming a first region of second type conductivity in the body including the bottom surface thereof, a P-N junction being formed by the contiguous surfaces of the material of the body and the region and being substantially parallel to the major surface;

c. etching selectively the major surface having the preferred planar orientation to form an array of planar trough-like depressions in the surface thereof, the trough-like depressions being oriented substantially aligned with a first preferred wire direction;

d. disposing at least one dopant material in each of the trough-like depressions in intrinsic contact with the material of the body which when migrated through the body will convert the material of the body to a second type conductivity and a selected resistivity;

e. heating the body and the metal wires to a preselected elevated temperature to form an array of liquid wires of metal and semiconductor material in the trough-like depressions on the surface;

f. establishing a temperature gradient of from 50° C/cm to 200° C/cm substantially along the vertical axis aof the body, the surface on which the liquid wires are formed being at the lower temperature;

g. migrating the liquid wires through the body and the first region from one major opposed surface to the other major opposed surface substantially along the vertical axis of the body and the first axis of the crystal structure to form a plurality of planar regions of recrystallized semiconductor material of the body having solid solubility of at least the dopant material therein which intersect and are integral with the first region;

h. etching selectively the top surface of the body to form a second array of linear trough-like depressions in the top surrface thereof, each of the trough-like depressions being oriented substantially aligned with a second preferred wire direction and at a first preselected angle to the first wire direction;

i. disposing at least one dopant material in each of the trough-like depressions in intiamate contact with the material of the body which when migrated through the body and the first region will convert the material of the body to a second type conductivity and a second resistivity;

j. heating the body and the material in the trough-like depressions to an elevated temperature sufficient to form an array of liquid wires of metal and semiconductor material in the trough-like depressions in the top surface;

k. establishing a temperature gradient substantially along the vertical axis of the body, the top surface being at the lower temperature; and l. migrating the liquid wires through the body and the first region from the top to the bottom surface substantially along the vertical axis of the body and the first axis of the crystal structure to form a plurality of second planar regions, which intersect and are integral with the first region and the plurality of first planar regions, the material of the second planar regions comprising recrystallized semiconductor material of the body having solid solubility of the at least one metal therein.

2. The method of claim 1 wherein
the semiconductor material of the body is one selected from the group consisting of silicon, silicon carbide, germanium and gallium arsenide.

3. The method of claim 2 wherein
the semiconductor material is silicon having N-type conductivity, and
the dopant material of the liquid wire is aluminum.

4. The method of claim 2 wherein
the preferred planar crystal orientation is (100),
the first trough-like depressions are oriented in a $< 011 >$ wire direction and the second trough-like depressions are oriented in a $< 0\bar{1}1 >$ wire direction, and
the direction of the first axis along which migration is practiced is $< 100 >$.

5. The method of claim 4 wherein
the semiconductor material of the body is one selected from the group consisting of silicon, silicon carbide, germanium and gallium arsenide.

6. The method of claim 5 wherein
the semiconductor material is silicon having N-type conductivity, and
the dopant material of the liquid wire is aluminum.

7. The method of claim 4 wherein
the first and second arrays of liquid metal wires are migrated simultaneously through the body of semiconductor material.

8. The method of claim 7 wherein
the semiconductor material of the body is silicon having N-type conductivity, and
the dopant material of the liquid metal is aluminum.

9. The method of claim 1 wherein
the preferred planar crystal orientation is (111);
the first trough-like depressions are oriented in a preferred wire direction which is one selected from the group consisting of $< 01\bar{1} >$, $< 10\bar{1} >$ and $< 1\bar{1}0 >$;
the second trough-like depressions are oriented in any other wire direction, and
the direction of the first axis along which migration is practiced is $< 111 >$.

10. The method of claim 9 wherein
the semiconductor material of the body is one selected from the group consisting of silicon, silicon carbide, germanium and gallium arsenide.

11. The method of claim 10 wherein
the semiconductor material of the body is silicon having N-type conductivity, and
the dopant metal of the liquid metal wires is aluminum.

12. The method of claim 9 wherein
the first and second arrays of liquid metal wires are migrated simultaneously through the body of semiconductor material.

13. The method of claim 12 wherein
the material of the body is silicon having N-type conductivity, and
the dopant material of the liquid metal wire is aluminum.

14. The method of claim 9 wherein
each of the second planar regions is substantially perpendicular to the plurality of first planar regions.

15. The method of claim 1 wherein
the preferred planar crystal orientation is (111);
the first trough-like depressions are oriented in a preferred wire direction which is one selected from the group consisting of $< 11\bar{2} >$, $< \bar{2}11 >$ and $< 1\bar{2}1 >$;
the second trough-like depressions are oriented in any other wire direction, and
the direction of the first axis along which migration is practiced is $< 111 >$.

16. The method of claim 15 wherein the semiconductor material of the body is one selected from the group consisting of silicon, silicon carbide, germanium and gallium arsenide.

17. The method of claim 16 wherein
the semiconductor material of the body is silicon having N-type conductivity, and
the dopant metal of the liquid metal wires is aluminum.

18. The method of claim 15 wherein
the first and second arrays of liquid metal wires are migrated simultaneously through the body of semiconductor material.

19. The method of claim 18 wherein
the material of the body is silicon having N-type conductivity, and
the dopant material of the liquid metal wires is aluminum.

20. The method of claim 15 wherein
each of the second planar regions is substantially perpendicular to the plurality of first planar regions.

21. The method of claim 1 wherein
the preferred planar crystal orientation is (111);
the first trough-like depressions are oriented in any of the wire directions;
the second trough-like depressions are oriented in any wire direction other than that of the wire direction orientation of the first trough-like depressions, and
the direction of the first axis along which migration is practiced is $<111>$.

22. The method of claim 21 wherein
the semiconductor material of the body is one selected from the group consisting of silicon, silicon carbide, germanium and gallium arsenide.

23. The method of claim 22 wherein
the semiconductor material of the body is silicon having N-type conductivity, and
the dopant metal of the liquid metal wires is aluminum.

24. The method of claim 21 wherein
the first and second arrays of liquid metal wires are migrated simultaneously through the body of semiconductor material.

25. The method of claim 24 wherein
the material of the body is silicon having N-type conductivity, and
the dopant material of the liquid metal wires is aluminum.

26. The method of claim 21 wherein
each of the second planar regions is substantially perpendicular to, intersect and are integral with the plurality of first planar regions.

27. The method of claim 1 including practicing the additional process steps after the migrating of the liquid metal wires of:
etching selectively the top surface of the body to form a third array of linear trough-like depressions in the surface thereof, the trough-like depressions being oriented substantially aligned with a third wire direction;
disposing at least one material in each of the third trough-like depressions in intimate contact with the material of the body which when migrated through the body will convert the material of the body to a second type conductivity and a selected resistivity;
heating the body and the material in the trough-like depressions to an elevated temperature sufficient to form an array of liquid wires of metal and semiconductor material in the trough-like depressions on the top-surface;
establishing a temperature gradient substantially along the vertical axis of the body, the top surface being at the lower temperature, and
migrating the liquid wires through the body and the first region from the top to the bottom surface substantially along the vertical axis of the body and the first axis of the crystal structure to form a plurality of third planar regions of recrystallized semiconductor material of the body having solid solubility of the at least one metal of the wire therein which intersect and are integral with the first region and the plurality of first and second planar regions.

28. The method of claim 27 wherein
the preferred planar orientation is (111);
the preferred wire direction is any suitable wire direction, and the first axis along which migration is practiced as $<111>$.

29. The method of claim 28 wherein
the first trough-like depressions are oriented in a $<01\bar{1}>$ wire direction;
the second trough-like depressions are oriented in a $<10\bar{1}>$ wire direction; and
the third trough-like depressions are oriented in a $<1\bar{1}0>$ wire direction.

30. The method of claim 28 wherein
the semiconductor material of the body is one selected from the group consisting of silicon, silicon carbide, germanium and gallium arsenide.

31. The method of claim 30 wherein
the semiconductor material of the body is silicon having N-type conductivity, and
the dopant metal of the liquid metal wires is aluminum.

32. The method of claim 27 wherein
forming of the first region is practiced by diffusion through the bottom surface of the body.

33. The method of claim 27 wherein
forming of the first region is practiced by the epitaxial growing of a layer of semiconductor material on the bottom surface of the body.

34. The method of claim 27 wherein
forming the first region is practiced upon completion of the migrating all of the metal "wires".

35. The method of claim 1 wherein
forming of the first region is practiced by diffusion through the bottom surface of the body.

36. The method of claim 1 wherein
forming of the first region is practiced by the epitaxial growing of a layer of semiconductor material on a major surface of the body.

37. The method of claim 1 wherein
forming of the first region is practiced upon completion of the migrating all of the metal "wires".

* * * * *